(12) United States Patent
Ninz et al.

(10) Patent No.: US 8,450,847 B2
(45) Date of Patent: May 28, 2013

(54) OPTOELECTRONIC SEMICONDUCTOR CHIP FITTED WITH A CARRIER

(75) Inventors: Patrick Ninz, Regensburg (DE); Herbert Brunner, Sinzing (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/126,096

(22) PCT Filed: Nov. 2, 2009

(86) PCT No.: PCT/DE2009/001549
§ 371 (c)(1),
(2), (4) Date: Jun. 2, 2011

(87) PCT Pub. No.: WO2010/081445
PCT Pub. Date: Jul. 22, 2010

(65) Prior Publication Data
US 2011/0285017 A1 Nov. 24, 2011

(30) Foreign Application Priority Data
Jan. 15, 2009 (DE) .......... 10 2009 004 724

(51) Int. Cl.
H01L 23/498 (2006.01)
H01L 23/10 (2006.01)
H01L 23/04 (2006.01)
H01L 23/58 (2006.01)

(52) U.S. Cl.
USPC ............ 257/737; 257/E23.068; 257/E21.499; 257/E25.032; 257/E31.118; 257/738; 257/734; 257/778; 257/98; 257/431; 257/434; 257/99; 257/680; 257/79; 257/80

(58) Field of Classification Search
USPC .................. 257/737, E23.068, E21.499, 738, 257/778, 734, 98, 431, 434, 99, 680, 79, 257/80, E25.032, E31.118; 52/2–4.6; 385/14, 385/52, 49, 88, 89, 91, 93
See application file for complete search history.

(56) References Cited

U.S. PATENT DOCUMENTS

| 4,935,856 A | 6/1990 | Dragoon |
| 5,223,672 A | 6/1993 | Pinneo |
| 6,395,124 B1 * | 5/2002 | Oxman et al. ............. 156/275.5 |
| 6,607,286 B2 | 8/2003 | West et al. |
| 6,674,159 B1 * | 1/2004 | Peterson et al. .............. 257/680 |
| 6,692,611 B2 * | 2/2004 | Oxman et al. ............. 156/275.5 |
| 6,791,259 B1 * | 9/2004 | Stokes et al. .................. 313/503 |
| 6,800,424 B2 * | 10/2004 | Xu et al. ........................ 430/321 |
| 6,803,159 B2 * | 10/2004 | Enloe ................................ 430/5 |
| 7,098,591 B1 | 8/2006 | Zhu et al. |

(Continued)

FOREIGN PATENT DOCUMENTS

| DE | 31 07 285 | 11/1983 |
| DE | 690 26 672 | 9/1996 |

(Continued)

Primary Examiner — Alexander O Williams
(74) Attorney, Agent, or Firm — DLA Piper LLP (US)

(57) ABSTRACT

A method for producing an optoelectronic device includes providing a carrier, applying at least one first metal layer on the carrier, providing at least one optical component, applying at least one second metal layer on the at least one optical component, and mechanically connecting the carrier to the at least one optical component by the at least one first and the at least one second metal layer, wherein the connecting includes friction welding or is friction welding.

8 Claims, 3 Drawing Sheets

U.S. PATENT DOCUMENTS

| | | | |
|---|---|---|---|
| 7,141,925 B2 | 11/2006 | Wittmann et al. | |
| 7,630,594 B2 * | 12/2009 | Lee et al. | 385/14 |
| 7,786,561 B2 * | 8/2010 | Pornin et al. | 257/682 |
| 8,106,584 B2 * | 1/2012 | Tabuchi et al. | 313/512 |
| 2005/0129372 A1 * | 6/2005 | Zheng | 385/94 |
| 2005/0130342 A1 * | 6/2005 | Zheng et al. | 438/106 |
| 2006/0022213 A1 * | 2/2006 | Posamentier | 257/99 |
| 2006/0191215 A1 * | 8/2006 | Stark | 52/204.6 |
| 2008/0001241 A1 * | 1/2008 | Tuckerman et al. | 257/434 |
| 2008/0049386 A1 * | 2/2008 | Pornin et al. | 361/679 |
| 2008/0085076 A1 * | 4/2008 | Lee et al. | 385/14 |
| 2008/0240659 A1 * | 10/2008 | Kopp | 385/88 |
| 2009/0065800 A1 | 3/2009 | Wirth et al. | |
| 2010/0072500 A1 | 3/2010 | Herrmann | |

FOREIGN PATENT DOCUMENTS

| | | |
|---|---|---|
| DE | 199 83 995 | 1/2003 |
| DE | 20 2004 015 932 | 12/2004 |
| DE | 103 29 366 | 6/2005 |
| DE | 602 05 806 | 6/2006 |
| DE | 20 2006 006 610 | 8/2006 |
| DE | 10 2007 004 304 | 7/2008 |
| EP | 1 617 655 | 1/2006 |
| GB | 2 392 555 | 3/2004 |
| JP | 2003-100921 | 4/2003 |
| WO | 2005/081319 | 9/2005 |
| WO | 2009/129947 | 10/2009 |

* cited by examiner

A)

B1)

B2)

C)

OPTOELECTRONIC SEMICONDUCTOR CHIP FITTED WITH A CARRIER

RELATED APPLICATIONS

This is a §371 of International Application No. PCT/DE2009/001549, with an international filing date of Nov. 2, 2009, which is based on German Patent Application No. 10 2009 004 724.7, filed Jan. 15, 2009, the subject matter of which is incorporated by reference.

TECHNICAL FIELD

This disclosure relates to a method for producing an optoelectronic device and an optoelectronic device.

BACKGROUND

DE 20 2006 006 610 U1 relates to a housing with an electrical circuit. However, it could be helpful to provide a method wherein an optical component is efficiently fitted to a carrier. It could also be helpful to provide an optoelectronic device wherein an optical component is permanently fitted to a carrier.

SUMMARY

We provide a method for producing an optoelectronic device including providing a carrier, applying at least one first metal layer on the carrier, providing at least one optical component, applying at least one second metal layer on the at least one optical component, and mechanically connecting the carrier to the at least one optical component by the at least one first and the at least one second metal layer, wherein the connecting includes friction welding or is friction welding.

We also provide an optoelectronic device including a carrier with at least one optoelectronic semiconductor chip on a main side of the carrier, at least one first metal layer on the main side of the carrier, at least one optical component with at least one second metal layer, wherein the at least one second metal layer faces the main side of the carrier, and at least one friction welding seam situated between the at least one first and the at least one second metal layer and by which the at least one optical component is mechanically connected to the carrier, wherein the friction welding seam is situated directly at the at least one first metal layer and/or at the at least one second metal layer.

DETAILED DESCRIPTION

Figure 1:
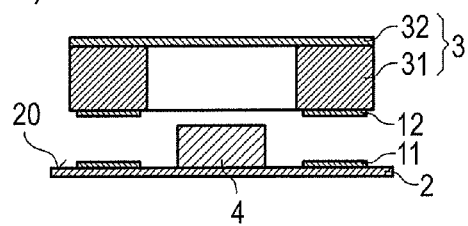
FIG. 1 shows a schematic illustration of a method described for producing one example of an optoelectronic device.
Figure 1:
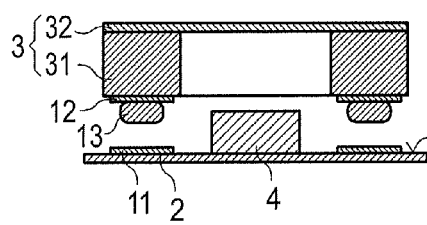
Figure 1:
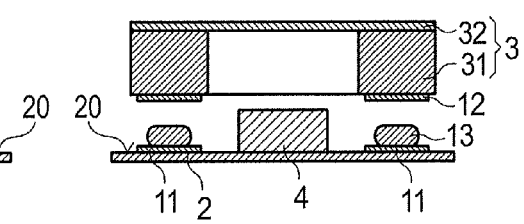
Figure 1:
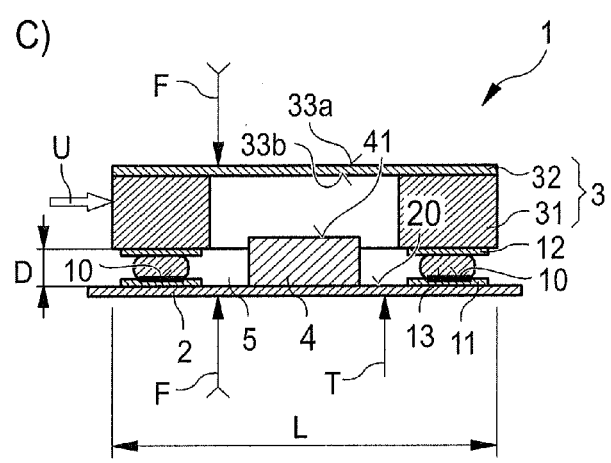

We provide a method that may comprise the step of providing a carrier. The carrier is designed to the effect that at least one optoelectronic semiconductor chip can be fitted thereon. Preferably, the carrier has a high thermal conductivity of at least 40 W/(m K), in particular of at least 110 W/(m K). The carrier can be a circuit board, a printed circuit board, "PCB" for short, a ceramic or a semiconductor material. The carrier can comprise electrical conductor tracks which can be fitted in, on or at a substrate material of the carrier. The conductor tracks can serve, for instance, for electrically driving the at least one optoelectronic semiconductor chip.

The method may comprise the step of applying at least one first metal layer on the carrier. The first metal layer is designed to impart a mechanical connection between the carrier and an optical component. The first metal layer does not serve, in particular, for an electrical contact-connection or electrical interconnection of the at least one optoelectronic semiconductor chip. The first metal layer is preferably electrically insulated from the optoelectronic semiconductor chip. The first metal layer can be applied by a photolithographic process such as by vapor deposition and/or an electrodeposition method.

The method may comprise the step of providing at least one optical component. The optical component can be a lens, a filter, a diffusing plate or a covering window. The optical component is, at least in places, transmissive or partly transmissive to electromagnetic radiation that is to be received or emitted by the semiconductor chip.

The method may comprise the step of applying at least one second metal layer on the at least one optical component. Like the first metal layer, too, the second metal layer is designed to produce a mechanical connection between the optical component and the carrier. The process of applying the second metal layer can be effected analogously to the process of applying the first metal layer.

The first and/or the second metal layer can also be configured as a metal layer sequence. By way of example, the first and/or the second metal layer comprise sublayers composed of chromium and gold or sublayers composed of nickel, palladium and gold.

The method may comprise the step of mechanically connecting the carrier to the at least one optical component. This process of mechanical connection is effected by the at least one first and the at least one second metal layer and includes friction welding. The friction welding is realized by ultrasound in particular. During the connecting process, the at least one first and the at least one second metal layer are at least indirectly connected to one another. In other words, a friction welding seam forms for example directly between the first and the second metal layer. It is likewise possible for at least one intermediate layer to be arranged between the first and the second metal layer and for the first and the second metal layer to be mechanically fixedly connected to one another indirectly by the at least one intermediate layer. In any event, at least the first or the second metal layer has a direct contact with the friction welding seam. It is also possible for the metal layers to completely or partly comprise the friction welding seam.

The method for producing an optoelectronic device may comprise the following steps:

providing a carrier,
applying at least one first metal layer on the carrier,
providing at least one optical component,
applying at least one second metal layer on the at least one optical component, and
mechanically connecting the carrier to the at least one optical component by the at least one first and the at least one second metal layer.

The connecting process includes friction welding.

During the process of mechanically connecting carrier and optical component by the metal layers, melting of a connecting agent, as in the case of soldering, for instance, does not take place. A liquid or viscous phase, for example, an adhesive, is not used either. It is thereby possible to prevent the connecting agent in a liquid or viscous state from propagating or running over regions of the carrier or of the optical component.

By way of example, in the case of a solder that is liquefied during the connecting process, there is the risk of the solder wetting conductor tracks and being able to lead to short circuits on the carrier, or of the optical component being contaminated. In the case of adhesives, by way of example, a gap penetration, that is to say a capability of the adhesive to creep or to flow in crevices or gaps, or a flow behavior is difficult to ensure reproducibly. Therefore, a delimitation of the adhesive, for instance, as long as the latter is present in a liquid or viscous phase, may be associated with complex configurations, for example of the carrier. Such configurations can constitute physical barriers via which the liquid adhesive cannot pass. As a result of the adhesive running, for example, conductor tracks or soldering areas can be contaminated. This necessitates complex cleaning, for example of the carrier, that is to be carried out after the adhesive bonding process.

During friction welding, metal layers that are in a solid state of matter are connected to one another. Therefore, complete or predominant liquefaction of the parts to be connected to one another does not take place. The spatial extent of the connecting locations is thus clearly definable. Moreover, in the case of friction welding, the connecting area is provided by metals. In contrast particularly to adhesives containing organic materials, this type of connection is particularly resistant to aggressive media such as, for example, cleaning agents or salt water. Moreover, metals, in contrast to polymers, for example, are resistant to the effect of light and increased temperatures such as can occur during the operation of the optoelectronic device to be produced.

During the process of connecting carrier and optical component, the carrier may be heated to a temperature of between 0° C. and 200° C. inclusive, in particular between 130° C. and 170° C. inclusive. Therefore, the connecting process takes place at comparatively moderate temperatures such that high thermal loading for instance for the optoelectronic semiconductor chip does not occur.

The at least one optoelectronic semiconductor chip may be applied on the carrier before the carrier and optical component are connected.

In the method, the optical component may be pressed onto the carrier with a press-on force of between 1 N and 90 N inclusive, in particular between 30 N and 50 N inclusive, during the process of connection to the carrier.

The ultrasonic power for the friction welding may be fed in exclusively via the optical component. In other words, no ultrasound is passed via the carrier to the first and/or second metal layer. This reduces the mechanical loads for the optoelectronic semiconductor chip during the connecting process. Microcracks, in particular, which can lead to a reduction of the lifetime of the optoelectronic semiconductor chip, can thereby be reduced.

The frequency of the ultrasound may be between 40 kHz and 100 kHz inclusive, in particular between 55 kHz and 65 kHz.

The ultrasonic power fed in during the process of connecting carrier and optical component may be between 0.1 W and 2.0 W inclusive, in particular between 0.5 W and 0.7 W.

The ultrasonic power may be applied for a time duration of between 0.2 s and 2.0 s inclusive, in particular between 0.5 s and 1.0 s inclusive.

At least one connecting bump may be applied to the at least one first and/or to the at least one second metal layer photolithographically and/or by a wire bonder. The connecting bump can be configured in a point-like or line-like fashion.

The thickness of the connecting bump exceeds the thickness of the first and of the second metal layer preferably by at least a factor of three, preferably by at least a factor of five. The at least one connecting bump is, for example, a spacer that defines a distance between the first and the second metal layer. In particular, the connecting bump is not a soldering ball or soldering pad that is predominantly or completely melted during the process of connecting carrier and optical component.

The first and the second metal layer and, if present, the connecting bump and also the friction welding seam may be free of a connecting agent. In other words, metal layers, connecting bump and friction welding seam comprise, in particular, no solder and no organic adhesive.

Furthermore, an optoelectronic device is specified. The optoelectronic device can be produced by one of the abovementioned methods. The optoelectronic device can comprise at least one feature as specified in conjunction with the methods. It is likewise possible for the methods described above to have features as described below in connection with examples of the optoelectronic device.

The optoelectronic device may comprise a carrier. The carrier has a main side, on which at least one optoelectronic semiconductor chip is fitted. By way of example, the semiconductor chip is a light-emitting diode or a laser diode. The optoelectronic semiconductor chip can be a thin-film chip as specified in WO 2005/081319 A1 or in DE 10 2007 004 304 A1, the subject matter of which with regard to the semiconductor chip described therein and the production method described therein is incorporated by reference.

The first metal layer may be fitted on the main side of the carrier. In this case, the first metal layer covers preferably at most 30%, in particular at most 10%, of the area of the main side of the carrier. The first metal layer can be applied to the main side of the carrier in a point-like, line-like and/or frame-like fashion.

The at least one second metal layer may be situated at the optical component. The second metal layer is applied to the optical component in such a way that it faces the main side of the carrier.

The friction welding seam may be situated between the first and the second metal layer or is completely or at least partly encompassed by the first and the second metal layer. The optical component is mechanically connected to the carrier by the friction welding seam. In particular, the optical component and the carrier are mechanically connected to one another exclusively by the friction welding seam. An area content of the friction welding seam, parallel to the main side of the carrier, is approximately equal to an area content of the first and the second metal layer. By way of example, the area contents of the first and second metal layers and of the friction welding seam deviate from one another by less than 30%, in particular by less than 10%.

The friction welding seam may be situated directly at the at least one first and/or directly at the at least one second metal layer or is completely or partly encompassed by them. In other words, a material of the friction welding seam is at least formed with a material of the metal layers or consists of the material of the metal layers. In this case, the friction welding seam is a layer that produces a mechanical connection between the parts to be connected. A mixture of the materials of the parts to be connected can be present in the region of the friction welding seam. On account of the ultrasonic welding a microscopic intermeshing of the material components to be connected can also be present in the region of the friction welding seam. The friction welding seam has, in particular, features which are characteristic of friction welding and which are accessible to examination by electron microscope, for instance. In other words, the friction welding seam is a substantive feature that can be demonstrated on the finished optoelectronic device.

The optoelectronic device may comprise a carrier with at least one optoelectronic semiconductor chip applied on a main side of the carrier. Furthermore, the optoelectronic device has at least one first metal layer on the main side of the carrier and at least one optical component. At least one second metal layer is situated at the optical component, wherein the at least one second metal layer faces the main side of the carrier. Furthermore, the optoelectronic device comprises a friction welding seam situated between the at least one first and the at least one second metal layer and by which the at least one optical component is mechanically connected to the carrier. In this case, the friction welding seam is situated directly at the at least one first and/or at the at least one second metal layer.

The at least one connecting bump may be situated between the first and the second metal layer. The connecting bump can be configured with the same material as the metal layers. An area content of the connecting bump preferably corresponds at most to an area content of the first and the second metal layer, in a plane parallel to the main side of the carrier. In other words, an area content of the connecting bump, relative to a plane parallel to the main side of the carrier, deviates from the area content of the metal layers by at most 30%, in particular by at most 20%, preferably by at most 10%.

A material of the first and of the second metal layer and a material of the connecting bump may in each case be either gold or aluminum.

The first and the second metal layer and also the connecting bump may be configured with a gold or aluminum alloy or consist of such an alloy. In other words, an essential material constituent of the metal layers and of the at least one connecting bump is gold or aluminum.

A total thickness composed of the first and composed of the second metal layer and composed of the connecting bump, in a direction perpendicular to the main side of the carrier, may be between 2 μm and 40 μm inclusive. If the optoelectronic device has no connecting bump, then a total thickness composed of first and second metal layers lies in the specified thickness range; the thickness of the connecting bump is then 0. By virtue of such comparatively large total thicknesses of the metal layers and of the connecting bump, it is possible to obtain a matching of different coefficients of thermal expansion between the carrier and the optical component, in particular during the process of connecting carrier and optical component. The metal layers and the connecting bump can therefore act as a type of buffer.

The first metal layer may enclose the at least one optoelectronic semiconductor chip in a frame-like manner at least in places. In other words, the optoelectronic semiconductor chip is bordered by the first metal layer completely or in places in the plane of the main side of the carrier. In this case, the first metal layer can form a closed frame-like line around the semiconductor chip, for example in the form of a rectangle, an oval or a circle. It is likewise possible for the first metal layer to be formed from a plurality of point-like structures and for these point-like structures to be configured similarly to a dotted line framing the optoelectronic semiconductor chip.

The first metal layer may be applied on the carrier in at least four, in particular in exactly four, regions. The regions, preferably configured with a small area or in a point-like fashion, are situated in particular exclusively at corners of a mounting area in which the optoelectronic semiconductor chip is connected to the carrier. Preferably, the mounting area is covered by the optical component. With a small area or in a point-like fashion can mean that each of the regions in which the first metal layer is applied on the carrier is an area of at most 10%, preferably of at most 5%, in particular of at most 2.5%, of a total area—facing the carrier—of a frame of the optical component.

The carrier and the optical component may enclose a volume in which the at least one optoelectronic semiconductor chip is situated. In this case, it is not necessary for the volume to be completely enclosed by the carrier and the optical component. In particular, it is possible for the volume not to be closed off in a gas-tight manner. Pressure equalization with respect to external surroundings of the optical component is thereby possible.

The optical component may not be in direct spatial contact with the semiconductor chip. In other words, no material of the optical component touches a material of the optoelectronic semiconductor chip.

The optical component may not be in direct electrical contact with the optoelectronic semiconductor chip. In other words, no electrical short circuit is present between the optoelectronic semiconductor chip and the optical component. In particular, the optical component can be electrically insulated from the optoelectronic semiconductor chip.

The volume may be closed off in a gas-tight manner. The optoelectronic device is thereby protectable in particular against moisture or, in an aggressive atmosphere, against corrosion.

The volume may not be closed off in a gas-tight manner. By way of example, the friction welding seam then does not completely frame the optoelectronic semiconductor chip. Pressure equalization between the volume and surroundings is thereby made possible.

The optical component may comprise a frame, at which the second metal layer is situated. Preferably, the frame is configured with a material that is opaque with respect to the radiation to be received or emitted by the optoelectronic semiconductor chip. In other words, the frame is preferably light-opaque.

The optical component may have an optical element. The optical element is transmissive, in particular transparent, to at least part of the radiation to be emitted or received by the optoelectronic semiconductor chip. The optical element is, in particular, a lens or a window.

The optical element may have at least two, in particular precisely two mutually opposite main areas. Preferably, one of the main areas faces the carrier and/or the optoelectronic semiconductor chip and the second main area faces away from the optoelectronic semiconductor chip and the carrier. Light refraction of the radiation to be emitted or received by the optoelectronic semiconductor chip is effected at both mutually opposite main areas. In other words, the light rays passing through the optical element, with the exception of those which impinge perpendicularly on one of the main areas, experience a deflection or change of a ray direction at the main areas.

The carrier may comprise a ceramic or consists of such a ceramic.

The optical component may comprise silicon and glass. In particular, the frame is fashioned with silicon and the optical element with glass.

The second metal layer may be applied on the silicon, that is to say, in particular, on the frame of the optical component. The frame and/or the silicon of the optical component preferably surround the optoelectronic semiconductor chip in a frame-like manner. In particular, the optoelectronic semiconductor chip is completely enclosed by the silicon of the optical component, in a direction parallel to the main side of the carrier.

Some areas of application in which optoelectronic devices described here can be used are, for instance, the backlighting systems of displays or display devices. Furthermore, optoelectronic devices described here can also be used in illumination devices for projection purposes, in headlights or light emitters or in general lighting.

A device described here and a method described here will be explained in greater detail below with reference to the drawings on the basis of examples. In this case, identical reference symbols indicate identical elements in the individual figures. In this case, however, no relationships to scale are illustrated. Rather, individual elements may be illustrated with an exaggerated size to afford a better understanding.

Turning now to the drawings, FIG. 1 schematically illustrates a method for producing an optoelectronic device 1 on the basis of sectional illustrations. In accordance with FIG. 1A, a carrier 2 and an optical component 3 are provided, in particular independently of one another. Before the optical component 3 is connected to the carrier 2, therefore, the optical component 3 and the carrier 2 can be completely produced and populated, respectively.

An optoelectronic semiconductor chip 4, for example a light-emitting diode, is fitted on a main side 20 of the carrier 2. In a lateral direction, parallel to the main side 20, the semiconductor chip 4 is situated between two first metal layers 11 applied to the main side 20 in areal fashion. The first metal layers 11 consist of gold or a gold alloy. The carrier 2 is, for example, a printed circuit board, PCB for short, or a ceramic.

The optical component 3 comprises a frame 31, which is fashioned with silicon, in particular, and an optical element 32. In this example, the optical element 32 is a glass plate, which is transparent to a radiation to be received or emitted by the semiconductor chip 14. Two second metal layers 12 are applied in areal fashion at a side of the frame 31 which faces the carrier 2. An area of the second metal layers 12 corresponds, with respect to an extent parallel to the main side 20 of the carrier 2, to the areas of the first metal layers 11 within the scope of the production tolerances.

In FIGS. 1 B1 and 1 B2, it can be seen that connecting bumps 13 are applied to the second metal layers 12 or to the first metal layers 11. The connecting pumps 13, which act as spacers, can be applied by a photolithographic process or using a machine for wire bonding. The connecting bumps 13 have, in a direction parallel to the main side 20, a somewhat smaller extent than the metal layers 11, 12.

FIG. 1C illustrates the connection of the optical component 3 and of the carrier 2, fashioned in accordance with FIG. 1 B1. The carrier 2 and the optical component 3 are pressed onto one another with a force F, symbolized by a double arrow line. The force F is approximately 40 N. The first metal layers 11 are heated via the carrier 2. The input of the temperature T is indicated by a single arrow line. The temperature T is approximately 150° C.

An ultrasound U required for friction welding is introduced into the optoelectronic device 1 with a power of approximately 0.6 W for a duration of approximately 0.7 s and at a frequency of approximately 60 kHz exclusively via the frame 31 of the optical component 3. The ultrasound U impressed into the frame 31 is symbolized by an arrow not filled in. Through the combination of the force F, the temperature T and the ultrasound U, a mechanically fixed and permanent connection is effected at an interface between the first metal layers 11 and the connecting bumps 13 by a friction welding seam 10. In this case, the friction welding seam 10 is formed by the materials of the connecting bumps 10 and of the first metal layers 11. The friction welding seam 10 is resistant to chemicals and photo-damage, thus resulting in a mechanically stable, permanent connection via the metal layers 11, 12 and the connecting bumps 13 between the optical component 3 and the carrier 2 with the semiconductor chip 4.

To compensate for thermal loads in particular during connection and during operation of the optoelectronic device 1, a total thickness D composed of the metal layers 11, 12 and the connecting bumps 13, in a direction perpendicular to the main side 20 of the carrier 2, is approximately 15 µm. The total thickness D is dependent on a lateral extent L of the optoelectronic device 1. The larger the lateral extent L, which, in particular, is in the range of between approximately 3 mm and 50 mm, the greater the total thickness D should be chosen. A thickness of the metal layers 11, 12 is, for example, in each case between 2 µm and 5 µm inclusive. A thickness of the connecting bump 13 is, for example, between 10 µm and 25 µm inclusive, preferably approximately 15 µm.

A radiation passage area 41 of the semiconductor chip 4 faces the optical element 32. The optical element 32 has two mutually opposite main areas 33a, b. The main area 33a faces away from the semiconductor chip 4, and the main area 33b faces the semiconductor chip 4 and the carrier 2. The optical component 3 is electrically insulated from the semiconductor chip 4. A volume 5 is substantially enclosed by the carrier 2 and the optical component 3.

The example of the device 1 in accordance with FIG. 2A substantially corresponds to that shown in FIG. 1C. However, two first metal layers 11a, b fitted one above the other in a direction perpendicular to the main side 20 are situated at the carrier 2. The first metal layer 11a is formed with chromium, for example, to ensure a high adhesion of the first metal layers 11a, 11b to the carrier 2. The metal layer 11b preferably consists of gold and is designed for connection by friction welding. Correspondingly, the metal layers 12a at the frame 31 are likewise fashioned with chromium, for example. The metal layers 12b are fashioned for example with gold or with some other material which exhibits good adhesion to the material of the connecting bumps 13. The connecting bumps 13 can also be fashioned with gold.

Alternatively, it is possible for the metal layers 12b, 11b and the connecting bumps 13 to be fashioned with aluminum or an aluminum alloy or some other material suitable for friction welding or to consist of such a material.

The optical element 32 fashioned as a flat plate can be a filter, a diffusing plate or a transparent plate. It is likewise possible for the optical element 32 to be provided with coatings that are reflective, antireflective or reflective or absorbent in a targeted manner in specific spectral ranges, said coatings not being depicted in FIG. 2A.

It is likewise possible for a conversion means to be fitted to the optical element, said conversion means converting at least part of the radiation emitted by the optoelectronic semiconductor chip 4 into a radiation having a different frequency. Such a conversion means can also be admixed with the material of the optical element 32 itself. The optoelectronic semiconductor chip 4 can be an LED, in particular a transparent thin-film LED. In contrast to the illustration shown in FIG. 2A, the device 1 can also have more than one semiconductor chip 4. A coating (not depicted in FIG. 2A) that is reflective with respect to the radiation to be generated or received by the semiconductor chip 4 can likewise be applied on the main side 20 of the carrier 2.

In the case of the example in accordance with FIG. 2B, the optical element 32 is shaped as a planoconvex converging lens. Light refraction of the radiation generated, in particular, by the semiconductor chip 4 is effected at both main sides 33a, b. In contrast to the illustration shown in FIG. 2B, the optical element 32 can also have other forms, for example light-distributing, concave-lens-like shapings. A shaping as a Fresnel lens or zone lens is also possible.

Furthermore, in the example in accordance with FIG. 2B, the metal layers 11b, 12b are joined together directly without the use of connecting bumps 13. The friction welding seam 10 is therefore formed exclusively by materials of the metal layers 11b, 12b.

Figure 2:
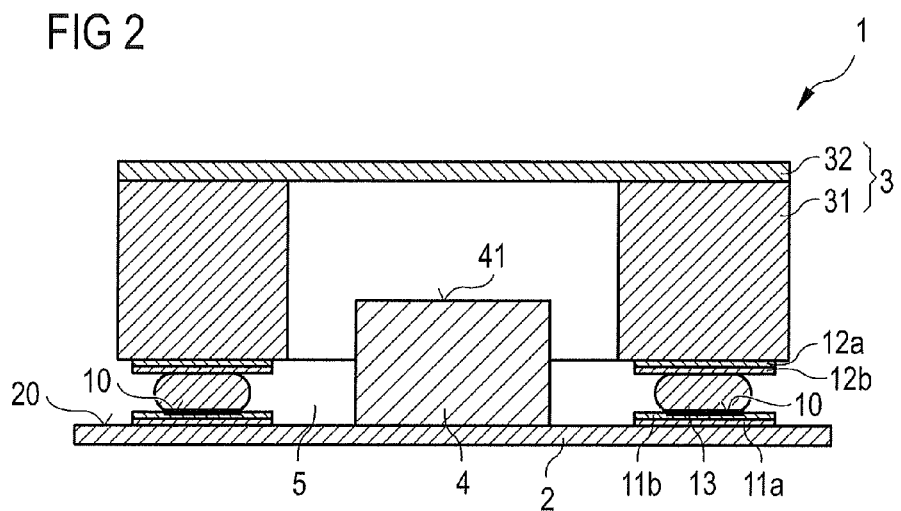
FIG. 2 shows schematic sectional illustrations of further examples of optoelectronic devices.
Figure 2:
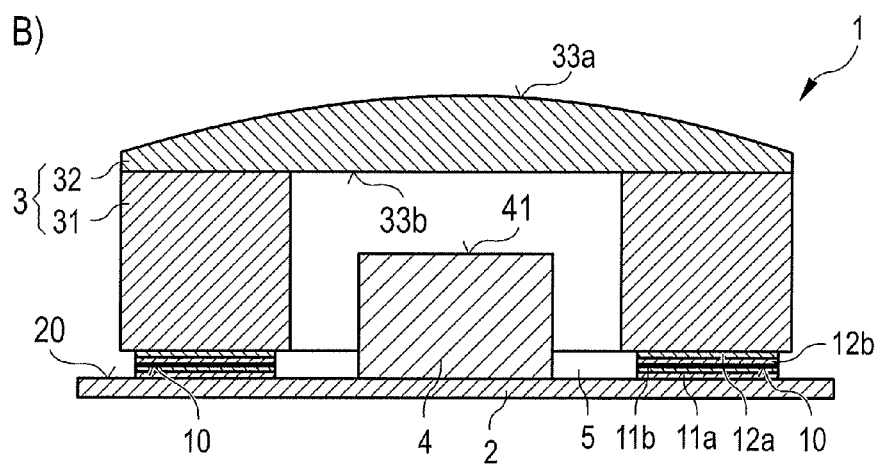
Figure 3:
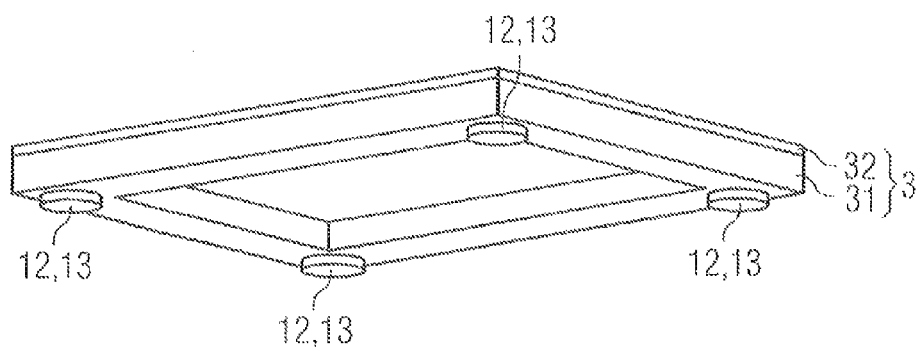
FIG. 3 shows schematic three-dimensional illustrations of examples of optical components.
Figure 3:
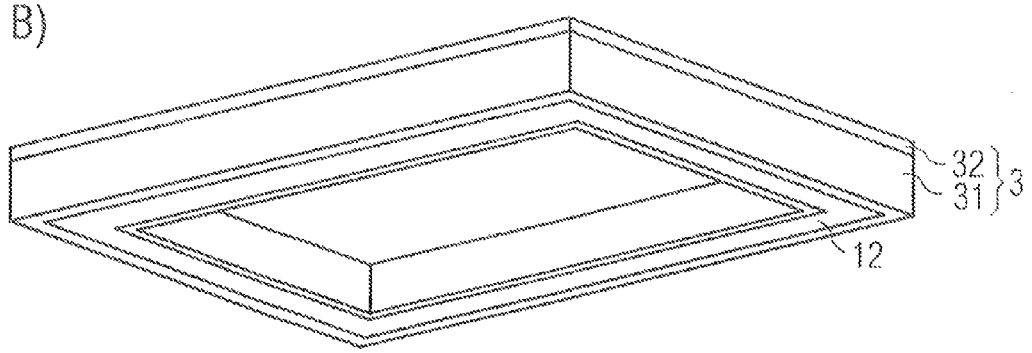

FIG. 3 shows further examples of the optical components 3 such as can be used in conjunction with, for instance, the examples in accordance with FIGS. 1 and 2. In the example in accordance with FIG. 3A, four circle-like second metallizations 12 and cylinder-like connecting bumps 13 are applied at corners at that side of the rectangular frame 31 which faces the carrier (not depicted in FIG. 3). A mechanical connection between optical component 3 at the carrier 2 (not depicted) is therefore effected by four comparatively small, point-like regions at the corners of the frame 31.

In accordance with FIG. 3B, the second metallization 12 forms of a circumferential, closed track at that side of the frame 31 which faces the carrier 2 (not depicted). As a result, it is possible for the volume 5 to be closed off in a gas-tight manner by the carrier 2 and by the optical component 3 and for the semiconductor chip 4 to be encapsulated. Optionally, it is likewise possible for a continuous, closed track of the connecting bump 13 to be applied on the second metal layer 12.

The methods and devices described herein are not restricted by the description on the basis of the examples. Rather, the disclosure encompasses any novel feature and also any combination of features, which in particular includes any combination of features in the appended claims, even if the feature or the combination itself is not explicitly specified in the claims or examples.

The invention claimed is:

1. An optoelectronic device comprising:
    a carrier with at least one optoelectronic semiconductor chip on a main side of the carrier;
    a first metal layer on the main side of the carrier;
    at least one optical component with a second metal layer, wherein the second metal layer faces the main side of the carrier; and
    a friction welding seam situated between the first and the second metal layer and by which the optical component is mechanically connected to the carrier;
    wherein the friction welding seam is situated either 1) directly at the first metal layer and at the second metal layer, or 2) directly at the first metal layer and an optional connecting bump situated between the first and the second metal layer, or 3) directly at the second metal layer and said optional connecting bump, and wherein 1) the first and the second metal layer and the optional connecting bump are made of gold or a gold alloy, 2) a mechanically fixed and permanent connection between the carrier and the optical component is effected by the friction welding seam, 3) the first metal layer is electrically insulated from the optoelectronic semiconductor chip, 4) the first metal layer is applied on the carrier in at least four regions configured in a point fashion, and 5) the carrier and the optical component enclose a volume in which the at least one optoelectronic semiconductor chip is situated and said volume is not closed off in a gas-tight manner.

2. The optoelectronic device according to claim 1, wherein a total thickness composed of the first metal layer, the second metal layer and the connecting bump, in a direction perpendicular to the main side of the carrier, is 2 µm to 40 µm.

3. The optoelectronic device according to claim 1, wherein the first metal layer partially encloses the optoelectronic semiconductor chip.

4. The optoelectronic device according to claim 1, wherein the optical component is not in direct spatial contact and not in direct electrical contact with the optoelectronic semiconductor chip.

5. The optoelectronic device according to claim 1, further comprising a radiation-opaque frame, at which the second metal layer is situated, wherein a radiation-transmissive optical element is fitted to a side of the frame remote from the carrier, the optical element has two main areas opposite one another and at which light refraction takes place, and the radiation-opaque frame and the radiation-transmissive optical element are both part of the optical component.

6. The optoelectronic device according to claim 1, wherein:
    the carrier comprises a ceramic;
    the optical component comprises silicon and glass;
    the second metal layer is applied on the silicon of the optical component; and
    the silicon of the optical component surrounds the optoelectronic semiconductor chip.

7. The optoelectronic device according to claim 1, wherein the area contents of the first and second metal layers and of the friction welding seem deviate from one another by less than 10%.

8. The optoelectronic device according to claim 1, wherein an area of the first metal layer applied on the carrier is at most 5% of an area of a frame of the optical component as seen from a top view.

* * * * *